US010935859B2

(12) United States Patent
Nishiyama et al.

(10) Patent No.: US 10,935,859 B2
(45) Date of Patent: Mar. 2, 2021

(54) ACTIVE MATRIX SUBSTRATE AND DISPLAY DEVICE INCLUDING SAME

(71) Applicant: Sharp Kabushiki Kaisha, Sakai (JP)

(72) Inventors: Takayuki Nishiyama, Sakai (JP); Ryo Yonebayashi, Sakai (JP); Kohhei Tanaka, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/495,457

(22) PCT Filed: Mar. 27, 2018

(86) PCT No.: PCT/JP2018/012334
§ 371 (c)(1),
(2) Date: Sep. 19, 2019

(87) PCT Pub. No.: WO2018/181264
PCT Pub. Date: Oct. 4, 2018

(65) Prior Publication Data
US 2020/0064701 A1    Feb. 27, 2020

(30) Foreign Application Priority Data
Mar. 29, 2017 (JP) .............................. JP2017-064460

(51) Int. Cl.
*G02F 1/1362* (2006.01)
(52) U.S. Cl.
CPC .... *G02F 1/136286* (2013.01); *G02F 1/13624* (2013.01); *G02F 1/136209* (2013.01); G02F 2001/136222 (2013.01); *G02F 2201/123* (2013.01)

(58) Field of Classification Search
CPC ........... G02F 1/13624; G02F 1/136209; G02F 1/136286; G02F 2001/136222
See application file for complete search history.

(56) References Cited

U.S. PATENT DOCUMENTS

2015/0293546 A1    10/2015 Tanaka et al.
2017/0255049 A1*    9/2017 Nishiyama .......... G02F 1/13454

FOREIGN PATENT DOCUMENTS

WO    2014/069529 A1    5/2014
WO    2016/080541 A1    5/2016

OTHER PUBLICATIONS

Official Communication issued in International Patent Application No. PCT/JP2018/012334, dated on Jun. 19, 2018.

* cited by examiner

*Primary Examiner* — Dung T Nguyen
(74) *Attorney, Agent, or Firm* — Keating & Bennett, LLP (57) ABSTRACT

Provide is a technique that enables to easily arrange driving circuits for driving gate lines within pixels, and to reduce display defects in a vertical stripe pattern. An active matrix substrate includes, in each pixel PIX, a pixel electrode 141, and a pixel switching element 10 that is connected with a gate line 13, a source line 15, and the pixel electrode 141. Driving circuit elements 110 of driving circuits for driving the gate lines 13 are arranged in a light-shielding area BM in a part of the pixels PIX in a display area. The pixel switching elements 10 in a row of the pixels in which the driving circuit element 110 is arranged are provided at non-uniform intervals, and drains of the pixel switching elements 10 in the same row are on the same side with respect to the source lines to which the pixel switching elements 10 are connected.

13 Claims, 10 Drawing Sheets

ACTIVE MATRIX SUBSTRATE AND DISPLAY DEVICE INCLUDING SAME

TECHNICAL FIELD

The present invention relates to an active matrix substrate, and a display device including the same.

BACKGROUND ART

WO2016/080541 discloses an active matrix substrate in which gate drivers for driving gate lines are provided in pixels. Circuit elements such as a switching element and the like that compose the gate driver are connected with control lines that supply control signals for driving the gate driver. In each pixel, a pixel control element that is connected with the gate line and the source line as well as the pixel electrode of the pixel is provided. Of the pixel control elements connected to one gate line, some pixel control elements are connected with the source lines in a direction opposite to the direction in which the other pixel control elements are connected with the source lines. Further, the source lines connected with the some pixel control elements are provided in openings of the pixels where the pixel control elements are provided.

SUMMARY OF THE INVENTION

In the case of the configuration disclosed in WO2016/080541, some of the source lines are provided in the openings of the pixels. In this case, a distance between adjacent source lines in the some of the source lines is wider than a distance between adjacent source lines in the other source line. In the configuration disclosed in WO2016/080541, however, the pixel control elements connected to the same gate line are not connected to the source lines in the same direction. Therefore, for example, in a case where layer displacement occurs when a gate layer and a source layer are formed, the areas of the parts in each of which the pixel control element is connected to the gate line and the source line vary, which cause capacitances of the pixel electrodes and the gate lines connected to the pixel control elements to vary. Consequently, the pull-in voltages of the pixels when the pixel control elements are turned OFF vary, which causes display defects in a vertical stripe pattern to occur.

It is an object of the present invention to provide a technique that enables to easily arrange driving circuits for driving gate lines within pixels, and to reduce display defects in a vertical stripe pattern.

An active matrix substrate according to the present invention is an active matrix substrate that includes a plurality of gate lines and a plurality of source lines, and has a display area composed of a plurality of pixels each of which is provided with a pixel electrode and has an opening and a light-shielding portion. The active matrix substrate includes a plurality of pixel switching elements provided in the light-shielding portions of the pixels, respectively, each of the pixel switching element being connected with one of the gate lines, one of the source lines, and one of the pixel electrodes; and a plurality of driving circuits provided with respect to the gate lines, respectively, each of the driving circuits switching a corresponding one of the gate lines into a selected state or a non-selected state, according to a control signal supplied thereto, wherein the driving circuit includes a plurality of driving circuit elements including a switching element; the driving circuit elements are arranged in the light-shielding portions in a part of the display area; the pixel switching elements in a pixel row including an element-arranged pixel where at least one of the driving circuit elements is provided are arranged at non-uniform intervals; and drains of the pixel switching elements connected with one same gate line are arranged on the same side with respect to the source lines to which the pixel switching elements are connected.

With the present invention, driving circuits for driving gate lines can be easily arranged within pixels, and display defects in a vertical stripe pattern can be reduced.

MODE FOR CARRYING OUT THE INVENTION

An active matrix substrate according to one embodiment of the present invention is an active matrix substrate that includes a plurality of gate lines and a plurality of source lines, and has a display area composed of a plurality of pixels each of which is provided with a pixel electrode and has an opening and a light-shielding portion. The active matrix substrate includes a plurality of pixel switching elements provided in the light-shielding portions of the pixels, respectively, each of the pixel switching element being connected with one of the gate lines, one of the source lines, and one of the pixel electrodes; and a plurality of driving circuits provided with respect to the gate lines, respectively, each of the driving circuits switching a corresponding one of the gate lines into a selected state or a non-selected state, according to a control signal supplied thereto, wherein the driving circuit includes a plurality of driving circuit elements including a switching element; the driving circuit elements are arranged in the light-shielding portions in a part of the display area; the pixel switching elements in a pixel row including an element-arranged one of the pixels where at least one of the driving circuit elements is provided are arranged at non-uniform intervals;

and drains of the pixel switching elements connected with one same gate line are arranged on the same side with respect to the source lines to which the pixel switching elements are connected (the first configuration).

According to the first configuration, the active matrix substrate includes of a driving circuit that switches a gate line into a selected state or a non-selected state, in a light-shielding portion in a part of a display area. The pixel switching elements in a row of pixels where driving circuit elements included in diving circuits are arranged at non-uniform intervals. This therefore makes it easier to arrange the driving circuit elements within the pixels, as compared with a case where all of the source lines are linear and the pixel switching elements are arranged at uniform intervals. Besides, the pixel switching elements connected to the same gate line are connected to the source lines in the same direction. Even if the gate layer and the source layer are displaced from each other, it is therefore unlikely that the pull-in voltage of the pixel when the pixel switching element is turned OFF would vary, whereby it is unlikely that display defects would occur.

The first configuration may be further characterized in that among the source lines, the source line connected with the pixel switching element of the element-arranged pixel is bent so as to avoid an opening of the element-arranged pixel and the driving circuit element (the second configuration).

The second configuration makes it easier to arrange the pixel switching element of the pixel where the driving circuit element is arranged, and the pixel switching element of another pixel, on the same side with respect to the source lines.

The first or second configuration may be further characterized in that the pixel electrode of the element-arranged pixel is different from the pixel electrode of a non-element-arranged one of the pixels in which no driving circuit element is arranged, regarding shape of a contact portion thereof to which the pixel switching element is connected (the third configuration).

The third configuration makes it easier to surely connect the pixel switching element of the pixel where the driving circuit element is arranged, and the pixel electrode.

Any one of the first to third configurations may be further characterized in that the contact portion connected with the pixel switching element, in the pixel electrode, has a smaller width in a gate line extending direction, than a width in the gate line extending direction of the pixel electrode in an opening (the fourth configuration).

With the fourth configuration, the capacitance of the pixel electrode is reduced, which makes it possible to reduce the electric power consumption in an operation of writing data into the pixel, as compared with a case where the widths of the pixel electrodes in the gate line extending direction are uniform.

Any one of the first to third configurations may be further characterized by further including a plurality of control lines that are connected with the driving circuits, respectively, and supply the control signals, wherein the element-arranged pixels include a plurality of the pixels that are adjacent in a gate line extending direction; one of the source lines connected with the pixel switching element of one of the adjacent ones of the pixels is bent, and is provided in an opening of one of the pixels that is on a side opposite to another pixel with respect to a boundary between the one of the adjacent ones of the pixels and the another pixel; and one of the control lines that is connected to the one of the driving circuit elements is arranged approximately in parallel with a source line extending direction in the light-shielding portion between the adjacent one of the pixies (the fifth configuration).

With the fifth configuration, the driving circuit element can be arranged so as to extend over a plurality of pixels without extending over the source line. This makes it possible to increase the size of the driving circuit element, or to arrange a plurality of the driving circuit elements collectively.

Any one of the first to third configurations may be further characterized by further including a plurality of control lines that are connected with the driving circuits and supply the control signals, wherein the element-arranged pixels include a plurality of the pixels that are adjacent in a gate line extending direction; one of the source lines connected with the pixel switching element of one of the adjacent ones of the pixels is bent, and is provided, for the one of the adjacent ones of the pixels, in a light-shielding area between the one of the adjacent ones of the pixels, and an adjacent pixel on a side opposite to the another pixel; the control line connected to the one of the driving circuit elements is arranged approximately in parallel to the source line extending direction in the light-shielding portion between the pixels; and the contact portion in the pixel electrode in contact with the pixel switching element has a shape extending in one direction with respect to an opening portion of the pixel electrode (the sixth configuration).

With the sixth configuration, an interval of the source lines for the pixels where the driving circuit elements are arranged can be widened, as compared with the fifth configuration. This makes it easier to arrange the driving circuit elements. Further, as the contact portion of the pixel electrode is in a shape extended in one direction, the directions in which the pixel switching elements are connected to the source lines can be easily aligned, and this makes it possible to decrease deterioration of the display quality that would be caused by the displacement of the gate layer and the source layer.

Any one of the first to sixth configurations may be further characterized in that the switching elements included in the driving circuit elements, and the pixel switching elements, contain an oxide semiconductor containing indium (In), gallium (Ga), zinc (Zn), and oxygen (O) as a semiconductor material (the seventh configuration).

With the seventh configuration, the pixels are allowed to have image definition enhancement and a greater aperture ratio, as compared with a case where amorphous silicon (a-Si), low temperature poly-silicon (LTPS), or the like is used as a semiconductor material for forming the switching elements as the driving circuit elements and the pixel switching elements.

A display device according to one embodiment of the present invention includes: the active matrix substrate according to any one of the first to seventh configurations; a counter substrate including a color filter; and a liquid crystal layer interposed between the active matrix substrate and the counter substrate (the eighth configuration).

The following description describes embodiments of the present invention in detail, while referring to the drawings. Identical or equivalent parts in the drawings are denoted by the same reference numerals, and the descriptions of the same are not repeated.

Embodiment 1

(Configuration of Liquid Crystal Display Device)

Figure 1:
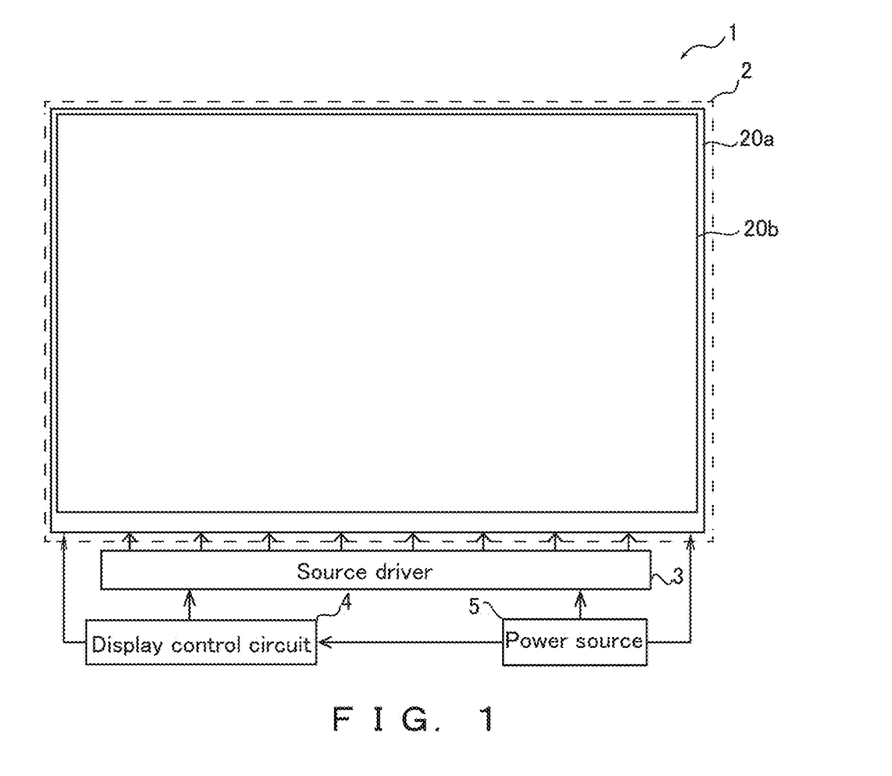
FIG. 1 is a schematic diagram showing a configuration of a liquid crystal display device according to the present embodiment.

FIG. 1 is a schematic diagram showing a configuration of a liquid crystal display device according to the present embodiment. The liquid crystal display device 1 includes a display panel 2, a source driver 3, a display control circuit 4, and a power source 5. The display panel 2 includes an active matrix substrate 20a, a counter substrate 20b, and a liquid crystal layer (not shown) interposed between these substrates. Though the illustration is omitted in FIG. 1, a pair of polarizing plates are provided so that the active matrix substrate 20a and the counter substrate 20b are interposed between the polarizing plates. Further, on the counter substrate 20b, there are formed a common electrode, a black matrix (BM), and color filters of three colors, which are red (R), green (G), and blue (B) (all are not shown).

As shown in FIG. 1, the active matrix substrate 20a is electrically connected with the source driver 3 formed on a flexible substrate. The display control circuit 4 is electrically connected with the display panel 2, the source driver 3, and the power source 5. The display control circuit 4 outputs control signals to the source driver 3, and driving circuits (hereinafter referred to as gate drivers) formed on the active matrix substrate 20a, which are described below. The power source 5 is electrically connected with the display panel 2, the source driver 3, and the display control circuit 4, so as to supply a power source voltage signal to each.

(Configuration of Active Matrix Substrate)

Figure 2:
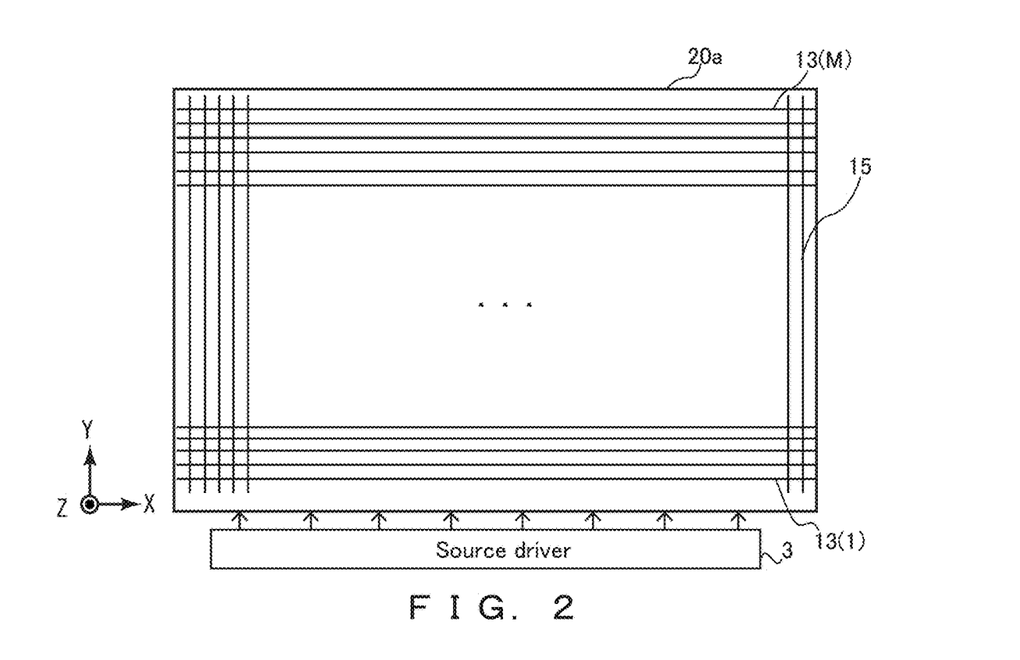
FIG. 2 is a schematic diagram showing a configuration of an active matrix substrate in FIG. 1.

FIG. 2 is a schematic diagram showing a schematic configuration of the active matrix substrate 20a. On the active matrix substrate 20a, M gate lines 13(1) to 13(M) (M: natural number) are formed approximately in parallel at uniform intervals from one end to the other end in the X-axis direction. In the following description, the gate lines are generally referred to as "gate lines 13" when the gate lines are not distinguished individually. Further, on the active matrix substrate 20a, a plurality of source lines 15 are formed so as to intersect with each gate line 13.

Figure 3:
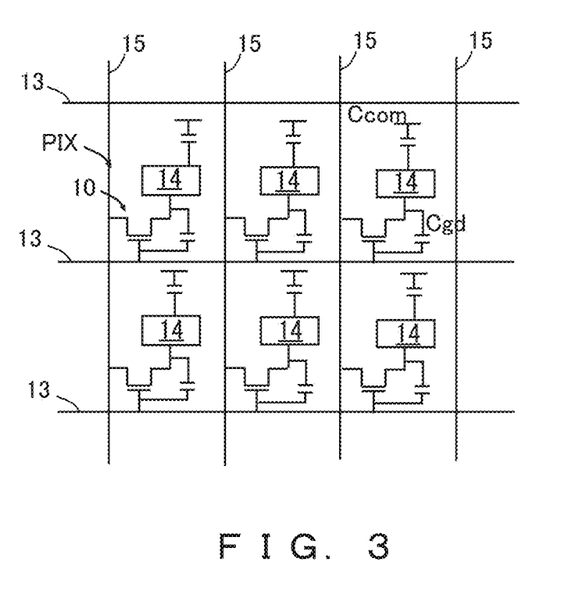
FIG. 3 shows a schematic configuration of a pixel in FIG. 2.

FIG. 3 schematically illustrates a schematic configuration of some of the pixels on the active matrix substrate 20a. As shown in FIG. 3, one pixel electrode 14 is arranged in each pixel PIX. The pixel FIX includes a thin film transistor (TFT) 10 that is connected with the gate line 13, the source line 15, and the pixel electrode 14 (this TFT is hereinafter referred to as a pixel TFT). Each pixel FIX corresponds to any one of the colors of the color filters, and the pixels PIX are arrayed in the gate line 13 extending direction in the order of R, G, and B.

When the pixel TFT 10 is turned ON, a data signal voltage is input to the pixel electrode 14 from the source driver 3 (see FIG. 2) through the source line 15. To the common electrode (not shown), a predetermined voltage is applied by the display control circuit 4 (see FIG. 1). The potential of the pixel PIX is controlled, depending on a potential of the source line 15, a capacitance Cgd between the pixel electrode 14 and the gate line 13, and a capacitance Ccom between the pixel electrode 14 and the common electrode (not shown), according to the variation of the potential of the gate line 13.

Figure 4:
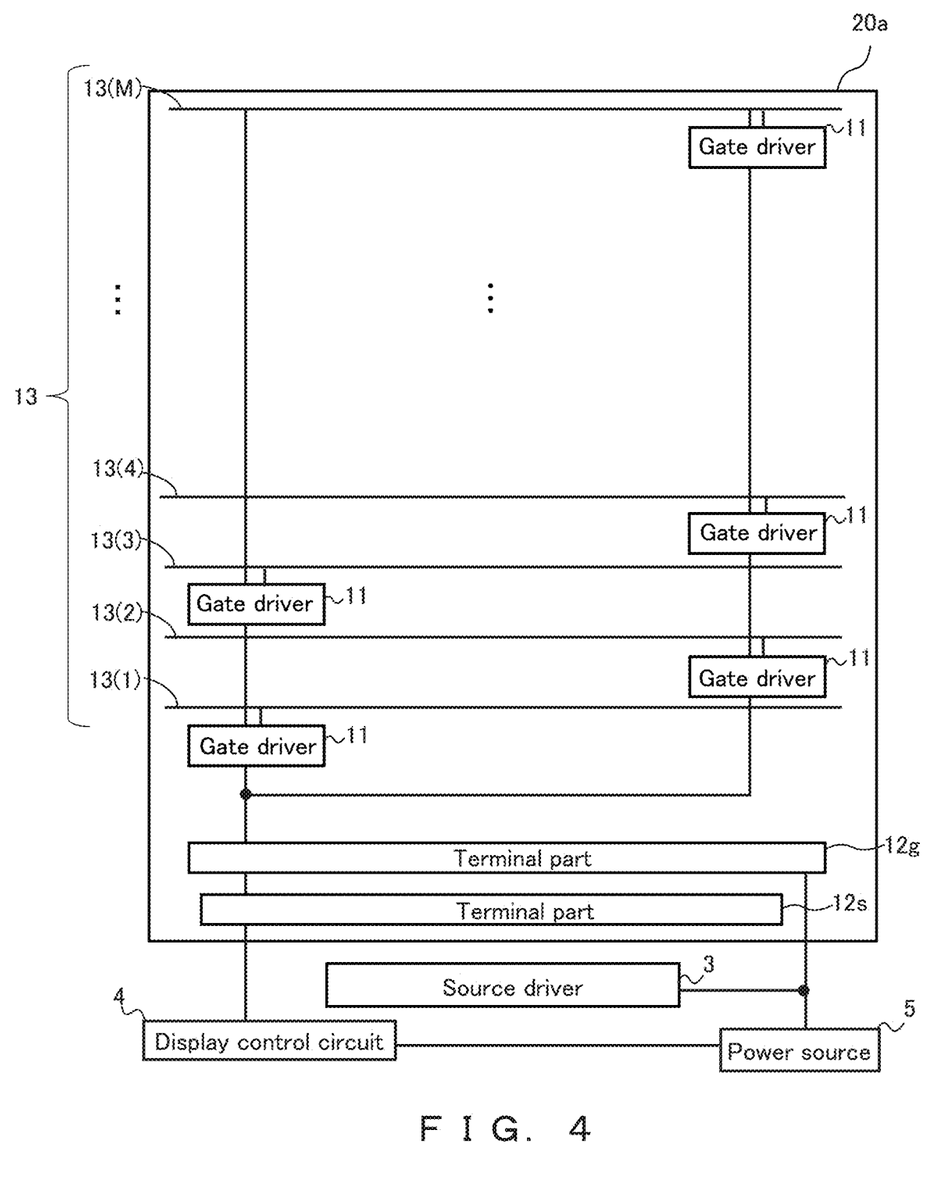
FIG. 4 shows a schematic diagram of an exemplary schematic arrangement of gate drivers in FIG. 2.

FIG. 4 shows an exemplary schematic arrangement of the gate drivers provided on the active matrix substrate 20a. In FIG. 4, for convenience sake, the illustration of the source lines 15 is omitted.

As shown in FIG. 4 as an example, one gate driver 11 is provided with respect to each gate line 13, and the gate driver 11 switches the gate line 13 corresponding thereto into a selected state or a non-selected state. In the following description, the operation of switching the gate line 13 into a selected state is referred to as "gate line driving" in some cases.

Each gate driver 11, except for the gate driver 11 for driving the gate line 13 in the first row, is arranged between the gate line 13 driven by the same and the gate line 13 adjacent to the foregoing gate line 13. The gate drivers 11 connected to the odd-numbered gate lines 13 (13(1), 13(3), 13(5), . . . ) are connected with one another via control lines 16. Further, the gate drivers 11 connected to the even-numbered gate lines 13 (13(2), 13(4), 13(6), . . . ) are connected with one another via control lines 16.

On the active matrix substrate 20a, in a frame region on a side where the source driver 3 is provided, terminal parts 12g and 12s are provided. The terminal part 12g is connected with the display control circuit 4 and the power source 5. Further, the terminal part 12g is connected with the display control circuit 4, the source driver 3, and the source lines 15 (see FIG. 2).

The display control circuit 4 supplies, as control signals, a signal whose potential repeatedly changes between an H level (VDD) and an L level (VSS) every one horizontal scanning period (hereinafter referred to as a clock signal), and a signal having a potential at the same level as the H level of the clock signal (hereinafter referred to as a reset signal) to the terminal part 12g.

The power source 5 supplies the power source voltage signal to the source driver 3 and the terminal part 12g.

The terminal part 12g receives signals supplied thereto such as the control signals and the power source voltage signal, and supplies the signals to each gate driver 11 via the control lines 16. The gate driver 11 outputs a voltage signal indicating either one of the selected state and the non-selected state, to the gate line 13 corresponding thereto, according to the signals supplied thereto. The source driver 3 outputs data signals to each source line 15 (see FIG. 2) via the terminal part 12s, according to the signals input from the display control circuit 4.

(Configuration of Gate Driver)

Figure 5:
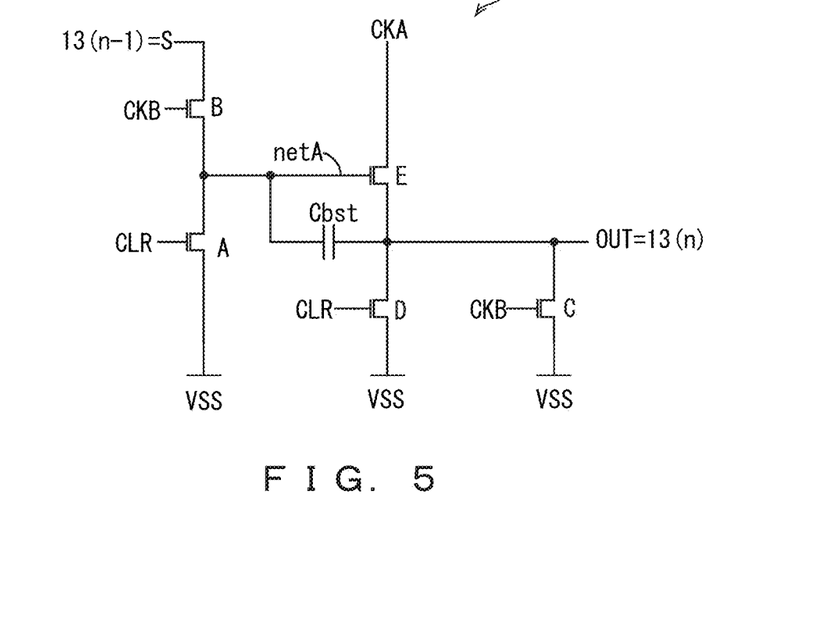
FIG. 5 shows an exemplary equivalent circuit of the gate driver in FIG. 4.

Next, the configuration of the gate driver 11 is described. FIG. 5 illustrates an exemplary equivalent circuit of the gate driver 11(n) that drives the gate line 13(n).

As shown in FIG. 5, the gate driver 11 includes thin film transistors (TFTs) denoted by alphabetic characters A to E (hereinafter referred to as TFTs-A to -E) as switching elements, a capacitor Cbst, and a netA as an internal line in the gate driver 11.

The drain terminal of the TFT-B is connected to the gate line 13(n−1) in the previous stage, the gate terminal thereof is connected to the control line 16 that supplies the clock signal CKB, and the source terminal thereof is connected to netA. The TFT-B controls the increase/decrease of the potential of the netA, according to the clock signal CKB and the gate line 13(n−1).

The drain terminal of the TFT-A is connected to the netA, the gate terminal thereof is connected to the control line 16 that supplies the reset signal CLR, and the source terminal thereof is connected to the control line 16 that supplies the power source voltage signal VSS. The TFT-A decreases the potential of the netA to the level of the power source voltage signal VSS, at a timing designated by the reset signal CLR.

The gate terminal of the TFT-E is connected to the netA, the drain terminal thereof is connected to the control line 16 that supplies the clock signal CKA, and the source terminal thereof is connected to the gate line 13(n).

The drain terminal of the TFT-D is connected to the gate line 13(n), the gate terminal thereof is connected to the control line 16 that supplies the reset signal CLR, and the source terminal thereof is connected to the control line 16 that supplies the power source voltage signal VSS.

The drain terminal of the TFT-C is connected to the gate line 13(n), the gate terminal thereof is connected to the control line 16 that supplies the clock signal CKB, and the source terminal thereof is connected to the control line 16 that supplies the power source voltage signal VSS.

Regarding the capacitor Cbst, one of electrodes thereof is connected with netA(n), and the other electrode thereof is connected with the gate line 13(n). The capacitor Cbst raises the potential of the netA(n) according to the potential of the clock signal CKA output from the TFT-E.

Incidentally, the connection of the clock signals CKA and CKB is alternated for the gate line 13(n+1) in the next stage and the gate line 13(n−1) in the previous stage. For example, in the next stage and the previous stage, the drain terminal of the TFT-E is connected with the control line 16 that supplies the clock signal CKB, and the gate terminals of the TFT-B and the TFT-C are connected to the control line 16 that supplies the clock signal CKA.

The reset signal CLR is, for example, a signal that is at the H level for a certain set period before the scanning of the gate line starts, and in this case, the reset signal CLR rises to the H level every vertical period. The rise of the reset signal CLR to the H level causes netA and the gate line 13 to be reset to the L level (the level of the power source voltage signal VSS). Further, at the start of one vertical period, to the gate line 13(1) in the first stage, a gate start pulse (GSF) is input as a set signal S from the display control circuit 4,
(Exemplary Operation of Gate Driver)

Figure 6:
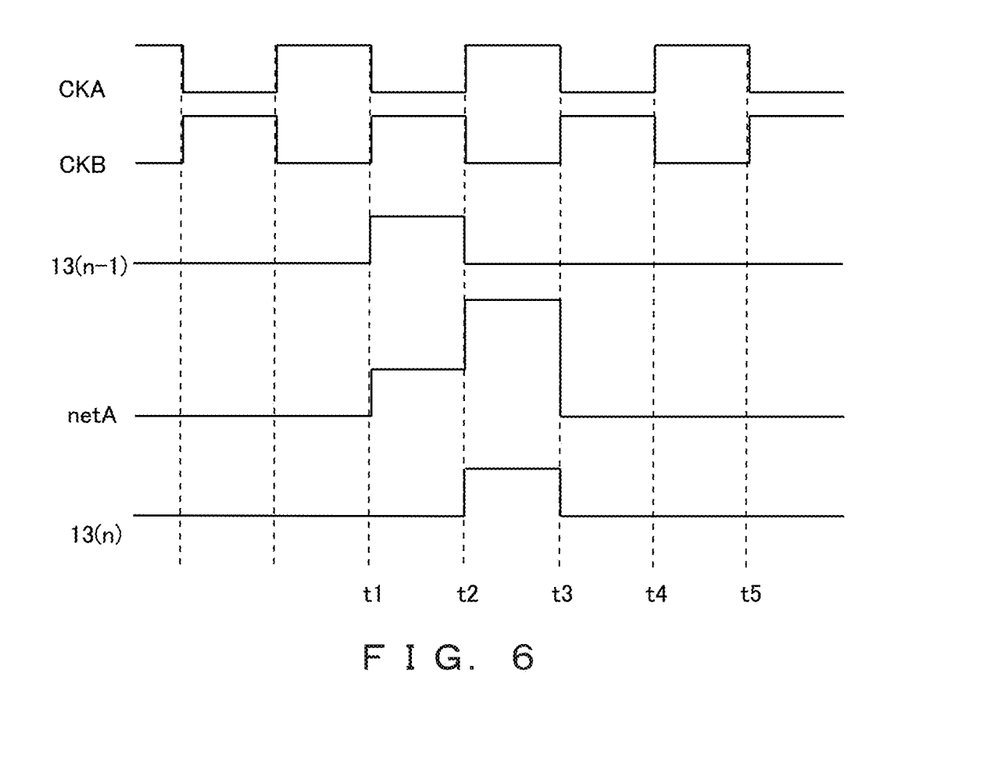
FIG. 6 is a timing chart illustrating timings when the gate driver in FIG. 4 drives a gate line.

The following description describes an operation performed when the gate driver 11(n) drives the gate line 13(n). FIG. 6 is a timing chart illustrating timings when the gate driver 11(n) drives the gate lines 13(n).

At time t1, when the gate line 13(n−1) in the previous stage becomes selected, the clock signal CKA shifts to the L level, and the clock signal CKB shifts to the H level. This causes the TFT-B to be turned ON, then causes the potential at the H level of the gate line 13(n−1) to be input to the drain terminal of the TFT-B, thereby causing the netA to be charged to the H level. Besides, the TFT-E is turned OFF, which causes the potential of the netA to be maintained without decreasing the potential During this period, the TFT-C is in the ON state, which causes the gate line 13(n) to have a potential at the L level.

At time t2, the clock signal CKA rises to the H level and the clock signal CKB falls to the L level, which causes the TFT-E to be turned ON and causes the TFT-C to be turned OFF. As the capacitor Cbst is provided between the netA and the gate line 13(n), the netA is charged to a potential higher than the H level of the clock signal CKA, as the potential of the drain of the TFT-F rises. During this period, the potential at the H level of the clock signal CKA is output to the gate line 13(n). This causes the gate line 13(n) to be selected, thereby causing the potential at the H level of the gate line 13(n) to be output as a set signal S to the gate driver 11(n+1) for driving the gate line 13(n+1) in the next stage.

At time t3, when the clock signal CKA shifts to the L level and the clock signal CKB shifts to the H level, the TFT-B is turned ON and the netA is charged to the L level. Besides, as the TFT-E is turned OFF and the TFT-C is turned ON, the gate line 13(n) is charged to the L level, thereby being switched to the non-selected state. Thereafter, the clock signal CKB and the TFT-C causes the potential of the gate line 13(n) to be maintained at the L
(Exemplary Arrangement of Circuit Elements)

Figure 7:
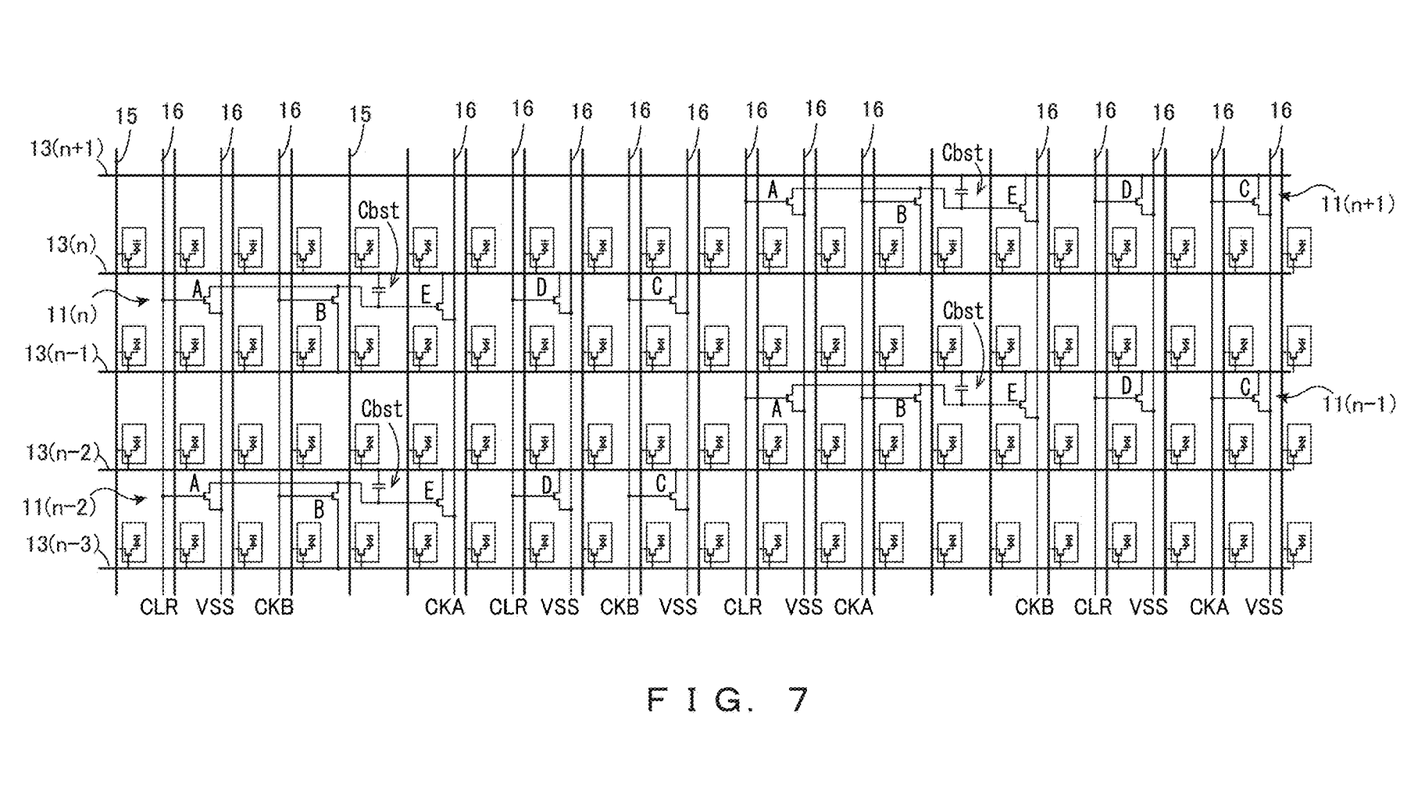
FIG. 7 is a schematic diagram of an exemplary arrangement of the circuit elements of the gate drivers in FIG. 5 in a case where the circuit elements are arranged in the display area.

Next, an exemplary arrangement of circuit elements of the gate drivers 11 is described. FIG. 7 is a schematic diagram showing an exemplary arrangement of the circuit elements of the gate drivers 11 in a case where the circuit elements are arranged in the display area.

FIG. 7 shows an exemplary arrangement of the gate drivers 11(n−2) to 11(n+1) that drive the gate lines 13(n−2) to 13(n+1), respectively.

As shown in FIG. 7, each gate drivers 11 is arranged between the gate line 13 driven by the gate driver 11 and the gate line 13 in the previous stage. Further, the gate driver 11(n−2) and the gate driver 11(n) are connected to each other via the control line 16 that is common to these gate drivers, and the gate driver 11(n−1) and the gate driver 11(n+1) are connected to each other via the control line 16 that is common to these gate drivers.

The circuit elements, i.e., the TFTs-A to -E denoted by the alphabetic characters A to E and the capacitor Cbst are arranged in the different pixels of the same row. Here, the configuration of the pixels where the circuit elements of the gate drivers 11 are arranged (hereinafter also referred to as an "element-arranged pixel") is described specifically.
(Specific Configuration of Pixel)

Figure 8A:
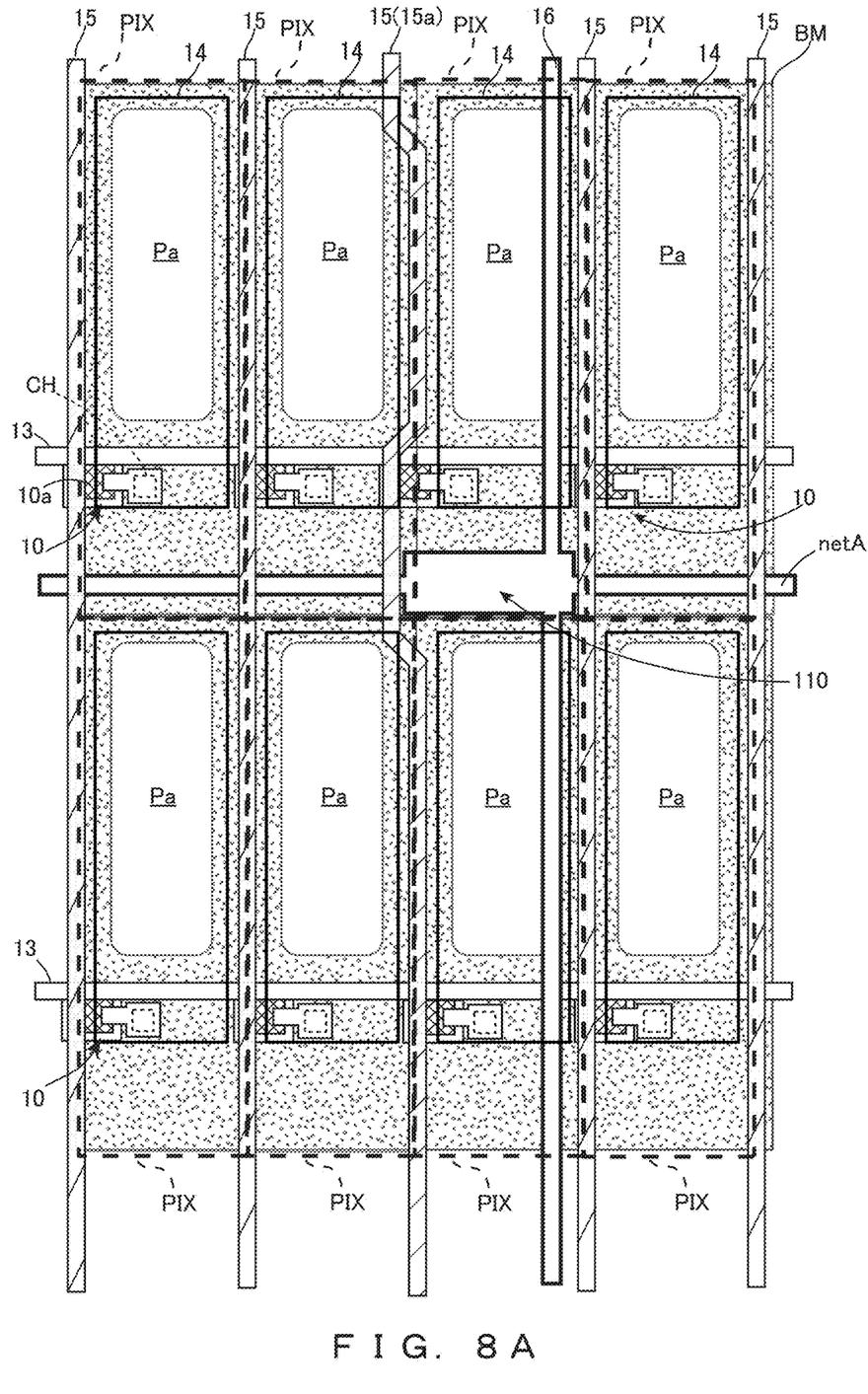
FIG. 8A is an enlarged schematic view showing some pixels including the pixels where the circuit elements of the gate driver are arranged.

FIG. 8A is an enlarged schematic view showing some pixels including the pixels where the circuit elements of the gate driver 11 are arranged.

As shown in FIG. 8, in each pixel PIX in a rectangular shape indicated by a broken-line frame, a part of the area thereof is light-shielded by the black matrix BM provided on the counter substrate 20b side, and an opening Pa is provided in an area where the pixel electrode 14 is provided.

In each pixel FIX, the pixel electrode 14 in a rectangular shape, and the pixel TFT 10 connected with the gate line 13 and the source line 15, are provided. The drain of the pixel TFT 10 and the pixel electrode 14 are connected via a contact hole CH. As shown in FIG. 8A, the pixel TFTs 10 connected with each gate line 13 are connected with the source lines 15 so as to be arranged on the right side with respect to the source lines 15. In other words, the drains of the pixel TFTs 10 connected to the same gate line 13 are arranged on the same side with respect to the source lines 15.

The gate lines 13, the source lines 15, the pixel TFTs 10, and the circuit element 110 are arranged in a light-shielding area covered with the black matrix BM. Further, the internal line netA, which is approximately parallel to the gate line 13, is arranged in the light-shielding area, and is connected with the circuit element 110. Further, the control line 16, which is connected with the circuit element 110 and is approximately parallel to the source line 15, is arranged in the opening Pa of the pixel where the circuit element 110 is provided.

Further, as shown in FIG. 8A, in the present embodiment, the source line 15 (15a) connected with the pixel TFT 10 of the pixel PIX where the circuit element 110 is arranged is bent so as to avoid the opening of the pixel PIX and the circuit element 110. More specifically, the source line 15a is bent so as to extend over the boundary between the pixel having the source line 15a and the pixel on the left side of the source line 15a in the light-shielding area so that the distance between the source lines in the area where the circuit element 110 is arranged is wider than the distance between the source lines in the area where the openings Pa are provided.

Incidentally, in the present embodiment, the boundary between the pixels that are adjacent in the horizontal direction (the gate line extending direction) is located at a position that approximately divides the light-shielding area between the openings Pa of the adjacent pixels into half.

Figure 8B:
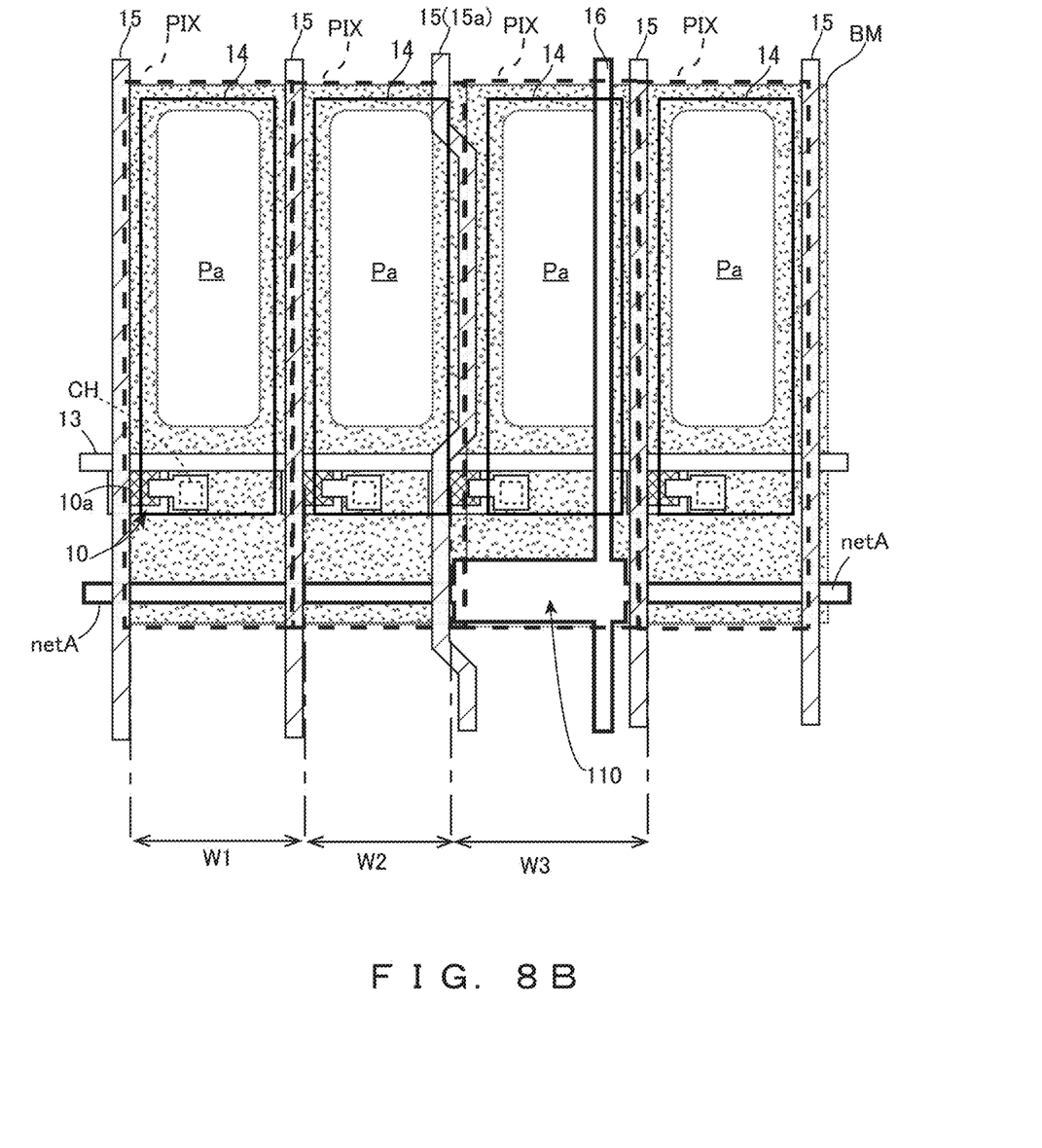
FIG. 8B explains pixel TFT pitch in a row where the circuit elements of the gate driver are arranged.

Besides, as the source line 15a is bent, the pixel TFT 10 connected with the source line 15a is also arranged so as to extend over the boundary between the adjacent pixels. Consequently, the row of the pixels FIX where the circuit element 110 is provided has portions where the pixels TFT 10 are arranged at small intervals and portions where the pixel TFTs 10 are arranged at large intervals. More specifically, as shown in FIG. 8B, the distances between the semiconductor layers 10a of the pixel TFTs 10 in the row of the circuit element 110-arranged pixel (hereinafter the distance is referred to as a "pixel TFT pitch"), which are distances W1, W2, and W3, respectively, satisfy the relationship of W2<W1<W3, In other words, in the row of the circuit element 110-arranged pixels, there are a small pixel TFT pitch (W2) and a large pixel TFT pitch (W1), with respect to a reference pitch, i.e., the pixel TFT pitch W1 between the pixel TFTs 10 connected to the source line 15 that is not bent. Thus, the pixel TFT pitches in the foregoing row are not uniform.

In Embodiment 1, the source line 15a is bent so that the space between the source lines is increased, and the area where the circuit element 110 is arranged is widened by the increase in the distance between the source lines. This allows the circuit element 110 to be arranged over two pixels, without extending over the source line 15, This makes it possible to increase the sizes of the TFTs that compose the gate driver 11, and to arrange a plurality of TFTs collectively, Incidentally, in a case where a plurality of TFTs are connected and arranged so as to extend over the source line 15 when the TFTs are arranged collectively, leakage current tends to occur at a portion where the line connecting the TFTs and the source line 15 intersect with each other, which causes a decrease in the yield. Further, parasitic capacitance at the intersection portion increases, thereby causing the electric power consumption to increase. In the present embodiment, the circuit element 110 can be arranged over a plurality of pixels, without extending over the source line 15, and such a problem therefore do not occur.

Besides, the pixel TFTs 10 are connected with the source lines 15 in such a manner that the drains of the pixel TFTs 10 connected to the same gate line 13 are arranged on the same side with respect to the source lines 15 to which the pixel TFTs 10 are connected. Therefore, even if the gate layer and the source layer are displaced, the degrees of variation of the capacitance of the pixel electrode 14 and the gate line 13 are equal, and it is unlikely that the pull-in voltage of the pixel when the pixel TFT 10 is turned OFF would vary, whereby it is unlikely that display defects in a vertical stripe pattern would occur.

Embodiment 2

Figure 9:
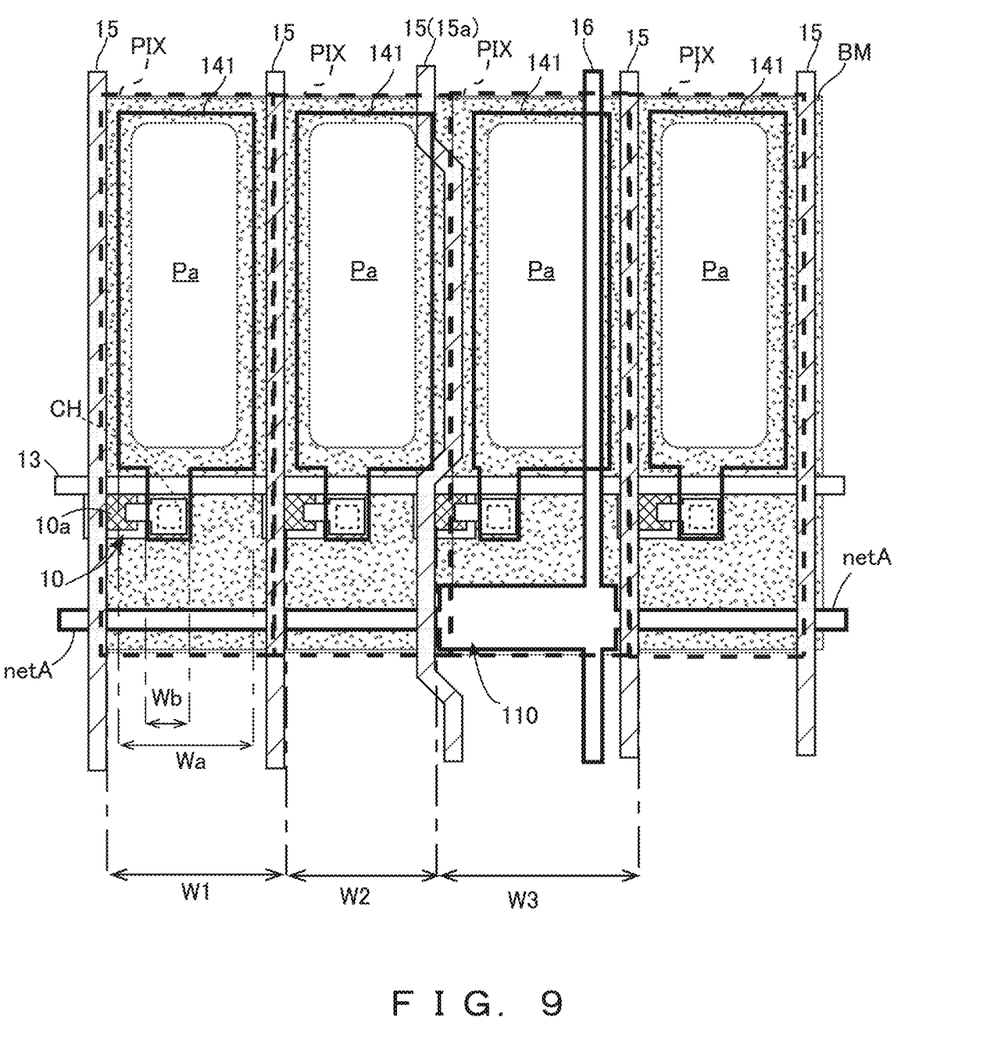
FIG. 9 is a schematic diagram showing a part of a row where a gate driver in Embodiment 2 is arranged.

The present embodiment is described with reference to an exemplary case where the shape of the pixel electrode is different from that in Embodiment 1. FIG. 9 is a schematic diagram showing a part of a row of element-arranged pixels where circuit elements of the gate drivers 11 are provided. In FIG. 9, members identical to those in Embodiment 1 are denoted by the same reference symbols in Embodiment 1.

The pixel electrode 14 in Embodiment 1 (see FIGS. 8A and 8B) is in a rectangular shape, and regarding the width of the pixel electrode 14 in the gate line 13 extending direction, the width thereof in the contact portion where the pixel TFT 10 is connected and the width thereof in the opening Pa portion are equal to each other. In contrast, a pixel electrode 141 in the present embodiment has such a non-rectangular shape that the contact portion connected with the pixel TFT 10 is projected, as shown in FIG. 9. More specifically, the width of the pixel electrode 141 in the gate line 13 extending direction is not uniform, because at least the width Wb of the pixel electrode 141 in the contact portion where the pixel TFT 10 is connected is smaller than the width Wa thereof in the opening Pa portion.

Further, the contact portion of the pixel electrode 141 in the element-arranged pixel PIX is arranged on the more leftward side (the source line 15a side) with respect to the portion of the pixel electrode 141 provided in the opening Pa, as compared with the other pixel electrodes 141, thereby having a shape different from that of the other pixel electrodes 141, It should be noted that all of the pixel electrodes 141 have an equal area.

In this way, the width of the contact portion of the pixel electrode 141 in contact with the pixel TFT 10 is set so as to be narrower than the width of the portion where the opening Pa is provided, whereby the pixel capacitance can be decreased as compared with Embodiment 1. As a result, charges necessary for charging the pixels decrease, which makes it possible to reduce the electric power consumption when data are written in the pixels.

Further, in a case where the pixel TFTs 10 in the pixels PIX have identical size and shape, the position of the drain of the pixel TFT 10 connected with the pixel electrode 14 of the element-arranged pixel is displaced toward the side of the bent source line 15a, as compared with the pixel TFTs 10 of the other pixels. In this case, when the pixel electrode 141 of the element-arranged pixel has a shape identical to that of the pixel electrode 141 of the other pixels, the drain of the pixel TFT 10 of the element-arranged pixel and the pixel electrode 141 are not appropriately connected in some cases, which causes an image not to be displayed. In the present embodiment, the contact portion of the pixel electrode 141 in the element-arranged pixel in contact with the pixel TFT 10 is arranged at a position displaced toward the source line 15a side as compared with the contact portions of the other pixel electrodes 141, whereby the pixel electrode 141 and the drain of the pixel TFT 10 can be connected with each other surely. In the present embodiment, therefore, it is easier to arrange the circuit elements of the gate drivers 11 in the pixels, and the electric power consumption can be reduced without impairment of display quality.

Embodiment 3

Embodiments 1 and 2 described above are described with reference to an exemplary case where the source lines are arranged in the light-shielding areas at the boundaries of the pixels; on the other hand, the present embodiment is described with reference to an exemplary case where the source line connected with at least the pixel TFT 10 of one pixel where the circuit element 110 is provided in the opening of the pixel.

Figure 10:
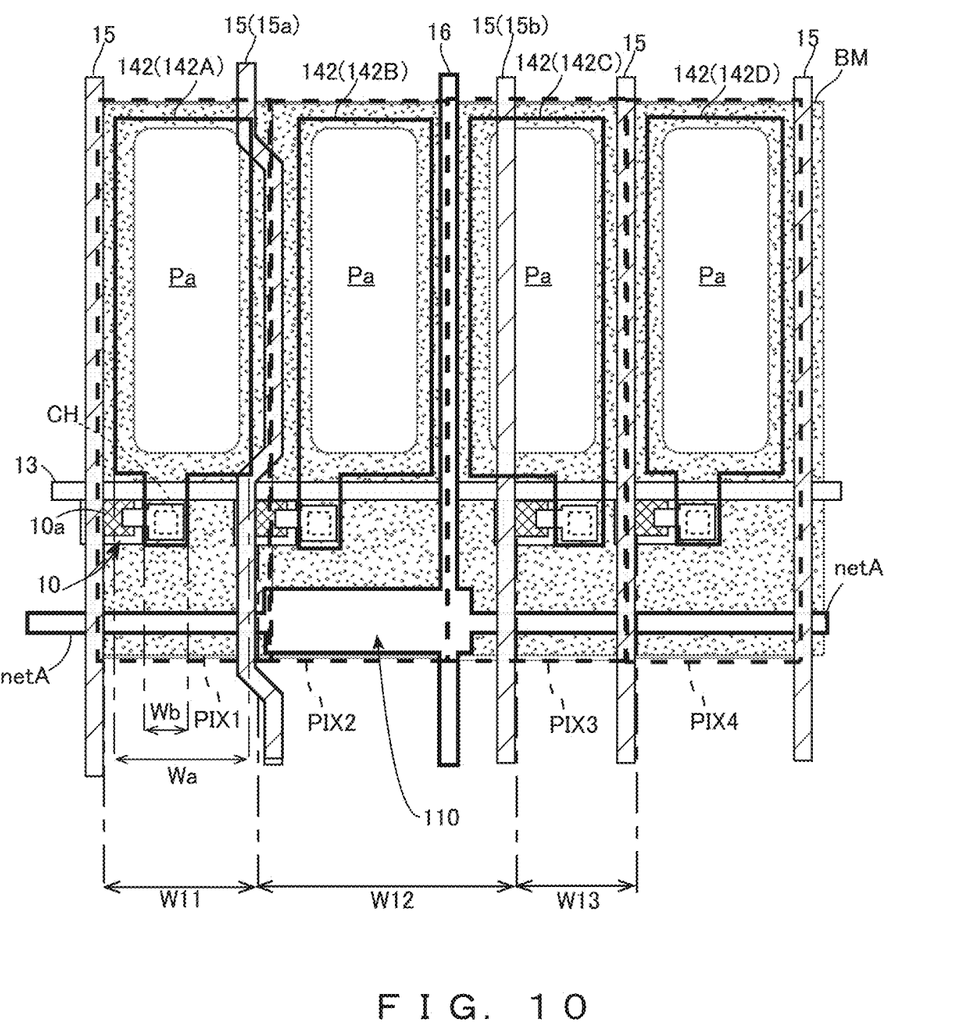
FIG. 10 is a schematic diagram showing a part of a row where a gate driver in Embodiment 3 is arranged.

FIG. 10 is a schematic diagram showing a part of a row of element-arranged pixels where circuit elements of the gate driver 11 in the present embodiment are provided. In FIG. 10, members identical to those in Embodiment 2 are denoted by the same reference symbols in Embodiment 2.

As shown in FIG. 10, the control line 16 connected with the circuit element 110 of the gate driver 11 is arranged in the light-shielding area between the pixel PIX2 and the pixel PIX3, and the circuit element 110 is arranged so as to extend over the boundaries of the pixels PIX1 to PIX3. Further, the source line 15 (15b), which is connected with the pixel TFT 10 of the pixel PIX3, is arranged in the opening Pa of the pixel PIX3. In other words, the source line 15b connected with the pixel TFT 10 of the pixel PIX3, which is one of the plurality of pixels PIX2, PIX3 where the circuit element 110 is provided, is arranged in the opening Pa of the pixel PIX2, which is on a side opposite to the pixel PIX2 with respect to the boundary between the pixel PIX2 and the pixel PIX3. Therefore, as compared with a case where the source line 15b is arranged on the boundary between the pixels PIX2 and PIX3, the area where the circuit element 110 is arranged can be enlarged.

In each of the pixels PIX1 to PIX4, the width Wb of the contact portion of the pixel electrode 142 (142A to 142D) in contact with the pixel TFT 10 is set so as to be smaller than the width Wa of the portion where the opening Pa is provided, as is the case with Embodiment 2. Further, in the present example, the pixel electrodes 142B, 142O have a shape different from that of other pixel electrodes 142A, 142D. More specifically, the contact portion of the pixel electrode 142B in contact with the pixel TFT 10 is arranged at the left end of the pixel electrode 142B, while the contact portion of the pixel electrode 142D is arranged at the right end of the pixel electrode 142D. Besides, the pixel TFTs 10 of the pixels PIX1 to PIX4 are connected with the source lines 15 in such a manner that the drains thereof are arranged on the right side with respect to the source lines 15 to which the pixel TFTs 10 are connected, respectively.

In this case, the pixel TFT pitch W11 between the pixel TFTs 10 of the pixels PIX1 and PIX2, the pixel TFT pitch W12 between the pixel TFTs 10 of the pixels PIX2 and PIX3, and the pixel TFT pitch W13 between the pixel TFTs 10 of the pixels PIX3 and PIX4 satisfy the relationship of W13<W11<W12.

Embodiment 3 described above is described with reference to an exemplary case where the source line 15a that is connected with the pixel TFT 10 of one of two pixels in which the circuit element 110 is arranged is bent, the source line 15b that is connected with the pixel TFT 10 of the other pixel is arranged in the opening of the other pixel, and the control line 16 that is connected with the circuit element 110 is arranged in the light-shielding area at the boundary of the two pixels. This allows the circuit element 110 to be arranged in an area larger than that in Embodiments 1 and 2, without extending over the source line 15. This makes it possible to arrange the circuit element 110 in a size greater than that in Embodiment 1 or 2, or to arrange more circuit elements 110 collectively.

Embodiment 4

Figure 11:
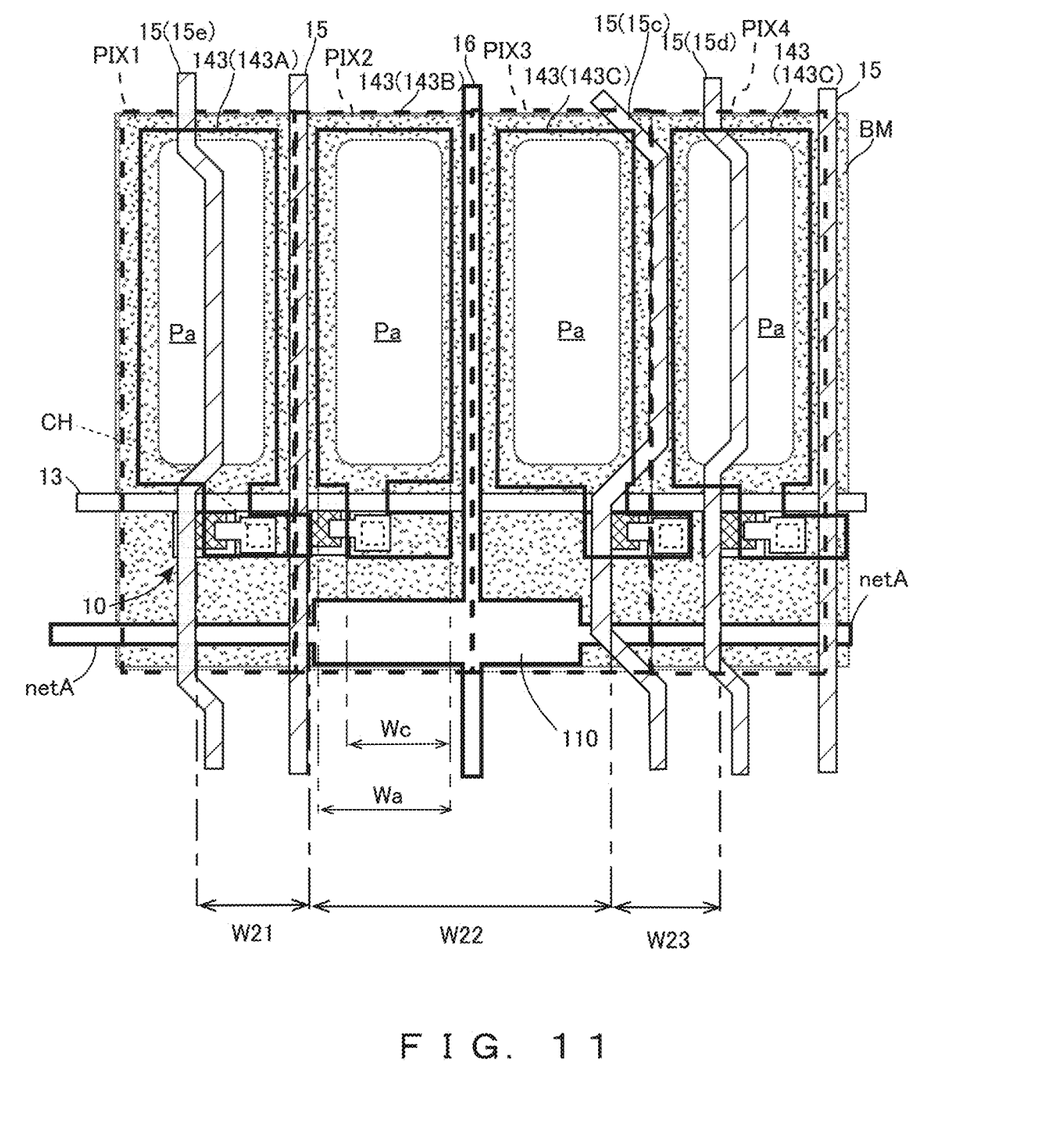
FIG. 11 is a schematic diagram showing a part of a row where a gate driver in Embodiment 4 is arranged.

The present embodiment is described with reference to an exemplary case where the structure of the pixel is different from that in Embodiment 3. FIG. 11 is a schematic diagram showing a part of a row of element-arranged pixels where circuit elements of the gate driver 11 in the present embodiment are provided. In FIG. 11, members identical to those in Embodiment 3 are denoted by the same reference symbols in Embodiment 3.

As shown in FIG. 11, the source lines 15c to 15e are all bent. Particularly, the source line 15c connected with the pixel TFT 10 of the pixel PIX3, of the pixels PIX2 and PIX3 where the circuit element 110 is provided, is bent more greatly as compared with the other source lines 15d and 15e, and is arranged in the light-shielding area between the pixels PIX3 and PIX4. On the other hand, the source line 15d, which is connected with the pixel TFT 10 of the pixel PIX4, is arranged in the opening Pa of the pixel PIX4, and the source line 15e, which is connected with the pixel TFT 10 of the pixel PIX1, is also arranged in the opening Pa of the pixel PIX1. The control line 16 connected with the circuit element 110 is arranged on the boundary between the pixels PIX2 and PIX3.

Incidentally, the source lines 15d and 15e are also bent in the present example, but these source lines may be linear. At least one source line connected with the pixel electrode of the pixel where the circuit element 110 or the control line 16 is provided may be bent.

In this way, regarding the pixels PIX2 and PIX3 where the circuit element 110 is provided, the source line 15c for the pixel PIX3, is arranged between this pixel PIX3 and the pixel PIX4 on a side opposite to the other one, i.e., the pixel PIX2. This allows the circuit element 110 to be arranged in an area larger than that in Embodiment 3, without extending over the source line 15c.

Further, as shown in FIG. 11, each of the contact portions of the pixel electrodes 143 (143A to 143D) in contact with the pixel TFTs 10 in the present embodiment has an L-letter shape extending in one direction in which the gate line 13 extends, and the contact portion has a width Wc that is greater than the width Wb of the contact portion in Embodiment 2 (see FIG. 10). The pixel electrodes 143A to 143D have an equal area, and each of the contact portions of the pixel electrodes other than the pixel electrode 143B, i.e., the pixel electrodes 143A, 143O, and 143D, is arranged so as to extend to the adjacent pixel, extending over the boundaries between the two pixels. Further, the pixel electrode 143C of the pixel PIX3, i.e., one of the pixels in which the circuit element 110 is arranged, has a shape different from that of the other pixel electrodes 143.

In other words, as shown in FIG. 11, the contact portion of the pixel electrode 143O is arranged on the more rightward side with respect to the portion of the pixel electrode 143C provided in the opening Pa, as compared with the contact portions of the other pixel electrodes 143. With this configuration, the pixel TFT 10 can be connected with the source line 15 in such a manner that the drain of the pixel TFT 10 connected to the pixel electrode 143O is arranged on the right side with respect to the source line 15O. This makes it possible to align the directions in which the pixel TFTs 10 connected to the same gate line 13 are connected with the source lines 15, thereby decreasing deterioration of the display quality that would be caused by the displacement of the gate layer and the source layer. It should be noted that in this case, as shown in FIG. 11, the pixel TFT pitches W21, W22, and W23 in the row where the circuit element 110 is arranged satisfy the relationship of W23<W21<W22.

The embodiments of the present invention are described as above, but the above-described embodiments are merely examples for implementing the present invention. The present invention, therefore, is not limited to the above-described embodiments, and the above-described embodiments can be appropriately varied and any of the same can be implemented in combination, without departing from the spirit and scope of the invention.

Modification Example (1) The configuration of the gate driver 11 used in the above-described embodiments is one example; the configuration of the gate driver is not limited to this, and may be any one as long as the configuration includes a plurality of switching elements.

(2) As a semiconductor material for the pixel TFT 10 and the TFTs that compose the gate driver 11 in the above-described embodiments, amorphous silicon (a-Si), or low temperature poly-silicon (LTPS), may be used, but oxide semiconductor containing indium (In), gallium (Ga), zinc (Zn), and oxygen (O) is more preferable. By using oxide semiconductor containing indium (In), gallium (Ga), zinc (Zn), and oxygen (O), image definition enhancement and a greater aperture ratio can be achieved more easily, as compared with a case where amorphous silicon (a-Si), or low temperature poly-silicon (LTPS), is used.

The invention claimed is:

1. An active matrix substrate comprising a plurality of gate lines and a plurality of source lines, and having a display area composed of a plurality of pixels each of which is provided with a pixel electrode and has an opening and a light-shielding portion, the active matrix substrate further comprising:
   a plurality of pixel switching elements provided in the light-shielding portions of the pixels, respectively, each of the pixel switching element being connected with one of the gate lines, one of the source lines, and one of the pixel electrodes; and
   a plurality of driving circuits provided with respect to the gate lines, respectively, each of the driving circuits switching a corresponding one of the gate lines into a selected state or a non-selected state, according to a control signal supplied thereto, wherein
   the driving circuit includes a plurality of driving circuit elements including a switching element,
   the driving circuit elements are arranged in the light-shielding portions in a portion of the display area,
   the pixel switching elements in a pixel row including an element-arranged pixel where at least one of the driving circuit elements is provided are arranged at non-uniform intervals,
   drains of the pixel switching elements connected with one same gate line are arranged on a same side with respect to the source lines to which the pixel switching elements are connected, and
   among the source lines, the source line connected with the pixel switching element of the element-arranged pixel is bent to avoid an opening of the element-arranged pixel and the driving circuit element.

2. The active matrix substrate according to claim 1, wherein the pixel electrode of the element-arranged pixel is different from the pixel electrode of a non-element-arranged one of the pixels in which no driving circuit element is arranged, regarding shape of a contact portion thereof to which the pixel switching element is connected.

3. The active matrix substrate according to claim 1, wherein the contact portion in the pixel electrode in contact with the pixel switching element has a smaller width in a gate line extending direction, than a width in the gate line extending direction of the pixel electrode in an opening.

4. The active matrix substrate according to claim 1, wherein the switching elements included in the driving circuit elements, and the pixel switching elements, contain an oxide semiconductor containing indium (In), gallium (Ga), zinc (Zn), and oxygen (O) as a semiconductor material.

5. A display device comprising:
   the active matrix substrate according to claim 1;
   a counter substrate including a color filter; and
   a liquid crystal layer interposed between the active matrix substrate and the counter substrate.

6. An active matrix substrate comprising a plurality of gate lines and a plurality of source lines, and having a display area composed of a plurality of pixels each of which is provided with a pixel electrode and has an opening and a light-shielding portion, the active matrix substrate further comprising:
   a plurality of pixel switching elements provided in the light-shielding portions of the pixels, respectively, each of the pixel switching element being connected with one of the gate lines, one of the source lines, and one of the pixel electrodes;
   a plurality of driving circuits provided with respect to the gate lines, respectively, each of the driving circuits switching a corresponding one of the gate lines into a selected state or a non-selected state, according to a control signal supplied thereto; and
   a plurality of control lines that are connected with the driving circuits, respectively, and supply the control signals, wherein
   the driving circuit includes a plurality of driving circuit elements including a switching element,
   the driving circuit elements are arranged in the light-shielding portions in a portion of the display area,
   the pixel switching elements in a pixel row including an element-arranged pixel where at least one of the driving circuit elements is provided are arranged at non-uniform intervals,
   drains of the pixel switching elements connected with one same gate line are arranged on a same side with respect to the source lines to which the pixel switching elements are connected,
   the element-arranged pixels include a plurality of the pixels that are adjacent in a gate line extending direction,
   one of the source lines connected with the pixel switching element of one of the adjacent ones of the pixels is bent, and is provided in an opening of one of the pixels that is on a side opposite to another one of the pixels with respect to a boundary between the one of the adjacent ones of the pixels and the another pixel, and
   one of the control lines that is connected to the one of the driving circuit elements is arranged approximately in parallel with a source line extending direction in the light-shielding portion between the adjacent ones of the pixels.

7. The active matrix substrate according to claim 6, wherein the pixel electrode of the element-arranged pixel is different from the pixel electrode of a non-element-arranged one of the pixels in which no driving circuit element is arranged, regarding shape of a contact portion thereof to which the pixel switching element is connected.

8. The active matrix substrate according to claim 6, wherein the switching elements included in the driving circuit elements, and the pixel switching elements, contain an oxide semiconductor containing indium (In), gallium (Ga), zinc (Zn), and oxygen (O) as a semiconductor material.

9. A display device comprising:
   the active matrix substrate according to claim 6;
   a counter substrate including a color filter; and
   a liquid crystal layer between the active matrix substrate and the counter substrate.

10. An active matrix substrate comprising a plurality of gate lines and a plurality of source lines, and having a display area composed of a plurality of pixels each of which is provided with a pixel electrode and has an opening and a light-shielding portion, the active matrix substrate further comprising:
- a plurality of pixel switching elements provided in the light-shielding portions of the pixels, respectively, each of the pixel switching element being connected with one of the gate lines, one of the source lines, and one of the pixel electrodes;
- a plurality of driving circuits provided with respect to the gate lines, respectively, each of the driving circuits switching a corresponding one of the gate lines into a selected state or a non-selected state, according to a control signal supplied thereto; and
- a plurality of control lines that are connected with the driving circuits, respectively, and supply the control signals, wherein
- the driving circuit includes a plurality of driving circuit elements including a switching element,
- the driving circuit elements are arranged in the light-shielding portions in a portion of the display area,
- the pixel switching elements in a pixel row including an element-arranged pixel where at least one of the driving circuit elements is provided are arranged at non-uniform intervals,
- drains of the pixel switching elements connected with one same gate line are arranged on a same side with respect to the source lines to which the pixel switching elements are connected,
- the element-arranged pixels include a plurality of the pixels that are adjacent in a gate line extending direction,
- one of the source lines connected with the pixel switching element of one of the adjacent ones of the pixels is bent, and is provided, for the one of the adjacent ones of the pixels, in a light-shielding area between the one of the adjacent ones of the pixels, and an adjacent pixel on a side opposite to the another pixel,
- the control line connected to the one of the driving circuit elements is arranged approximately in parallel to the source line extending direction in the light-shielding portion between the pixels, and
- the contact portion in the pixel electrode in contact with the pixel switching element has a shape extending in one direction with respect to an opening portion of the pixel electrode.

11. The active matrix substrate according to claim 10, wherein the pixel electrode of the element-arranged pixel is different from the pixel electrode of a non-element-arranged one of the pixels in which no driving circuit element is arranged, regarding shape of a contact portion thereof to which the pixel switching element is connected.

12. The active matrix substrate according to claim 10, wherein the switching elements included in the driving circuit elements, and the pixel switching elements, contain an oxide semiconductor containing indium (In), gallium (Ga), zinc (Zn), and oxygen (O) as a semiconductor material.

13. A display device comprising:
- the active matrix substrate according to claim 10;
- a counter substrate including a color filter; and
- a liquid crystal layer between the active matrix substrate and the counter substrate.

* * * * *